US008227764B2

(12) United States Patent
Mannino et al.

(10) Patent No.: US 8,227,764 B2
(45) Date of Patent: Jul. 24, 2012

(54) YTTRIA-METAL THERMIONIC FILAMENTS

(75) Inventors: Rosario Mannino, North Haven, CT (US); Adam Patkin, Hamden, CT (US)

(73) Assignee: PerkinElmer Health Sciences, Inc., Waltham, MA (US)

( * ) Notice: Subject to any disclaimer, the term of this patent is extended or adjusted under 35 U.S.C. 154(b) by 134 days.

(21) Appl. No.: 12/508,963

(22) Filed: Jul. 24, 2009

(65) Prior Publication Data

US 2010/0019142 A1 Jan. 28, 2010

Related U.S. Application Data

(60) Provisional application No. 61/083,534, filed on Jul. 25, 2008.

(51) Int. Cl.
*H01J 37/077* (2006.01)
*H01T 23/00* (2006.01)

(52) U.S. Cl. .................. 250/423 F; 250/281; 250/423 R

(58) Field of Classification Search .............. 250/423 R, 250/423 F; 313/359.1, 362.1
See application file for complete search history.

(56) References Cited

U.S. PATENT DOCUMENTS

| | | | | |
|---|---|---|---|---|
| 5,389,853 | A | 2/1995 | Bigio et al. | |
| 5,416,322 | A * | 5/1995 | Chace et al. | 250/288 |
| 7,129,478 | B2 * | 10/2006 | Baba et al. | 250/281 |
| 2007/0200060 | A1 * | 8/2007 | Russ et al. | 250/288 |

FOREIGN PATENT DOCUMENTS

EP 1890124 A1 2/2008

OTHER PUBLICATIONS

Manura, John. "Yttria Coated Mass Spectrometer Filaments", The Mass Spec Source, vol. XXVII, No. 1., Fall, 2005, http://www.sisweb.com/news/sep2005.pdf.*

Manura, John. "Yttria Coated Mass Spectrometer Filaments", The Mass Spec Source, vol. XXVII. No. 1, Fall, 2005, p. 3-4, http://www.sisweb.com/news/sep2005.pdf.*

Manura, John. "Yttria Coated Mass Spectrometer Filaments", The Mass Spec Source, XXVII, No. 1, Fall 2005, p. 3-4, http://www.sisweb.com/news/sep2005.pdf.*

Gear, P.E. "The Choice of Cathode Material in a Hot Cathode Ionization Gauge", Pergamon Press Ltd., Vacuum, vol. 26, No. 1, Aug. 8, 1975, Great Britain, pp. 3-10.*

Cleaver, J.S., "A New High Pressure Ionization Gauge," *J. Sci. Instrum.*, 1967 vol. 44, pp. 969-972.

Gear, P. E., "The Choice of Cathode Material in a Hot Cathode Ionization Gauge," *Pergamon Press Ltd.*, Vacuum, vol. 26, No. 1, Aug. 8, 1975, Great Britain, pp. 3-10.

*Bayard-Alpert Gauge Filaments: Tungsten or Thoria?*, Stanford Research Systems, Inc., <www.thinkSRS.com>, 5 pages.

* cited by examiner

*Primary Examiner* — Jack Berman
*Assistant Examiner* — David E Smith
(74) *Attorney, Agent, or Firm* — Cesari and McKenna, LLP

(57) ABSTRACT

A thermionic electron source comprises a nonlinear metallic substrate, a coating of yttria deposited on the substrate, and a current source configured to drive current through the metallic substrate.

24 Claims, 2 Drawing Sheets

YTTRIA-METAL THERMIONIC FILAMENTS

CROSS-REFERENCE TO RELATED APPLICATIONS

The present application claims the benefit of U.S. Provisional Patent Application Ser. No. 61/083,534, which was filed on Jul. 25, 2008, by Rosario Mannino et al. for FILAMENTS FOR MASS SPECTROMETERS and is hereby incorporated by reference.

BACKGROUND OF THE INVENTION

1. Field of the Invention

This invention relates to thermionic filaments. In particular, this invention relates to apparatus and methods for sustaining thermionic emission in mass spectrometry systems.

2. Background Information

Mass spectrometry is a technique for analyzing a specimen, which may include a solvent in addition to a sample containing one or more analytes. Mass spectrometric analysis is based on the dependence of ion trajectories through electric and magnetic fields on respective ion mass/charge ratio. The prevalence of constituent ions in the specimen is measured as a function of mass/charge ratio and the data are assembled to generate a mass spectrum of the specimen. In a common operational mode, known as electron ionization, the specimen is ionized by means of bombardment by thermionically emitted electrons in an ion source.

The thermionic electron source typically incorporates a filament of a high-melting metal such as tungsten, rhenium, iridium, platinum or an alloy thereof. The emission current of thermionically emitted electrons is related to, among other parameters, the surface area of the filament. Consequently, a filament morphology incorporating bends or turns, such as a coil, may augment the emission current from a given instrumentation volume, compared to a straight wire filament.

Analysis by mass spectrometry is commonly enhanced by combination with analytical techniques that separate the specimen into constituents before ionization in the mass spectrograph. For example, in a common enhancement a gas chromatograph separates the specimen into constituents before it arrives at the spectrometer ion source. This arrangement, termed gas chromatography-mass spectrometry ("GC/MS"), is widely used to identify unknown samples, for example in environmental analysis and drug, fire and explosives investigations. The separative powers of gas chromatography enable GC/MS systems to identify substances to a much greater certainty than is possible using a mass spectrometry assembly alone.

Elution from the gas chromatography unit of the solvent portion of the specimen may stress the thermionic electron source due to its relatively large volume and concomitant quantity of ionizable entities. Consequently, the thermionic filament in a GC/MS system is typically kept unenergized as the solvent fraction passes through the ion source, during a time period known as the "solvent delay." Power to the thermionic filament is cycled on when the specimen constituents dissolved in the solvent are eluting. Solvent delay is known to protect the ion source thermionic filament from one type of lifetime-limiting stress. However, cycling of the filament current brings its own hazards to the filament. Alternating on and off phases cycles may give rise to stresses on the coiled filament due to thermal expansion and electromagnetically induced effects. As a result, relative movement between portions of a coiled filament, such as adjacent turns, may bring the portions into contact, ending the usefulness of the filament. In addition, a coiled filament may creep after cycling and prolonged high-temperature operation until the filament is no longer optimally placed within the ion source, compromising its efficiency. Increasing the filament current to reestablish the desired emission current may exacerbate degradation of the coil shape rather than improving performance.

There is, accordingly, a need for a GC/MS ion source thermionic filament that is robust to time variations in the filament current and long-term creep.

SUMMARY OF THE INVENTION

A thermionic electron source comprises a nonlinear yttria-metal filament. The nonlinear yttria-metal filament comprises a metallic substrate coated with yttria. A filament current source is configured to drive a filament current through the nonlinear yttria-metal filament so that it emits electrons. The yttria-metal filament requires a substantially lower filament current to emit an electron emission current of a magnitude equal to that emitted by a correspondingly dimensioned nonlinear metallic substrate that does not have the yttria coating. The relatively low filament current driving the nonlinear yttria-metal thermionic filament protects adjacent portions in the yttria-metal filament from early mutual contact and retards creep so that the filament is operable over an extended lifetime.

BRIEF DESCRIPTION OF THE DRAWINGS

The invention description below refers to the accompanying drawings, wherein identical reference symbols designate like structural elements, and in which.

DETAILED DESCRIPTION OF AN ILLUSTRATIVE EMBODIMENT

Figure 1:
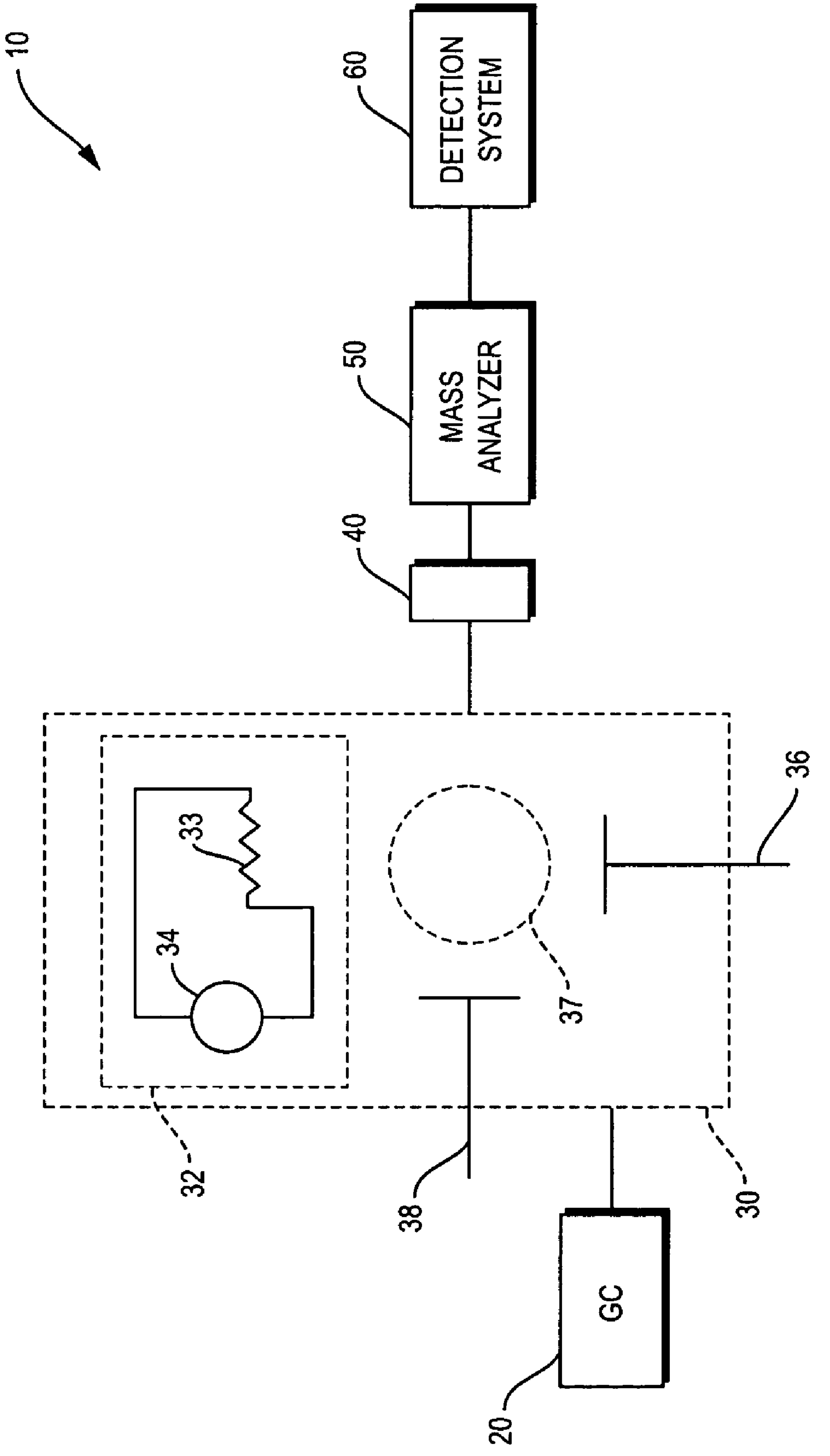
FIG. 1 schematically depicts a thermionic electron source having a nonlinear yttria-metal filament fabricated in accordance with an embodiment of the invention, disposed in a GC/MS apparatus.

With reference to FIG. 1, in an illustrative embodiment, a gas chromatography-mass spectrometry system 10 incorporates a gas chromatograph 20, an ion source 30, an ion-guiding apparatus 40, a mass analyzer 50 and a detection system 60. Particular attributes of the gas chromatograph 20, ion source 30, ion-guiding apparatus 40, mass analyzer 50, and detection system 60, as well as ancillary components such as voltage supplies and magnets (not shown), assembled to constitute the GC/MS system 10 tailor the capabilities of the system 10 to analysis of particular sample types or to acquisition of specialized data. Considerations informing the construction of GC/MS apparatus are known to those skilled in the art. The structure and operation of GC/MS systems is described in co-owned U.S. patent application Ser. No. 12/019,308, "Components for Reducing Background Noise in a Mass Spectrometer," which is incorporated by reference herein in its entirety.

The gas chromatograph 20 is configured to receive and fractionate a specimen and provide the separated constituents to the ion source 30. The ion source 30 is configured to ionize the constituents and propel them toward the ion-focusing apparatus 40.

In the illustrative ion source 30, a thermionic electron source 32 comprises an yttria-metal nonlinear filament 33 and a filament current source 34, arranged to energize the yttria-metal nonlinear filament 33, thereby sustaining thermionic emission of electrons from the filament 33. The yttria-metal nonlinear filament 33 comprises a metallic substrate, which may be, e.g., a wire or ribbon, constituting the backbone of the filament 33 and an yttria coating over the metallic substrate. As used herein, "nonlinear filament" refers to a filament having a plurality of portions capable of mutual contact upon relative movement when the nonlinear filament is fixed and operating in the thermionic electron source 32. For example, the nonlinear yttria-metal filament 33 may be a substantially helical coil, a planar spiral, a zigzag, hairpin or serpentine structure. In alternative embodiments, the ion source 30 may incorporate a linear yttria-metal filament such as a straight filament.

Figure 2A:
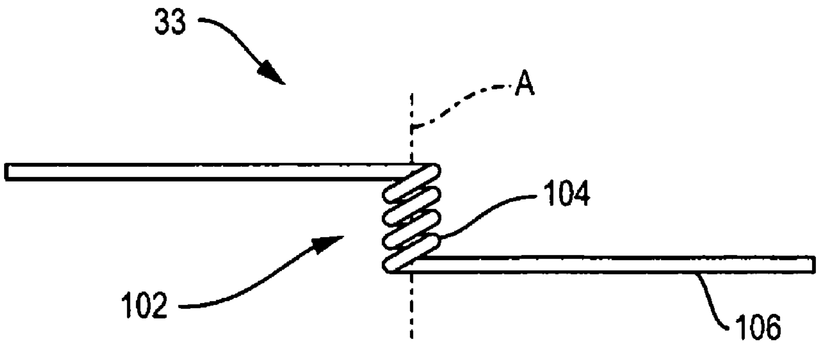
FIGS. 2A-2B depict an yttria-metal coiled filament fabricated in accordance with an embodiment of the invention, FIG. 2A being a perspective view of the filament and FIG. 2B being an axial view along the axis A.
Figure 2B:
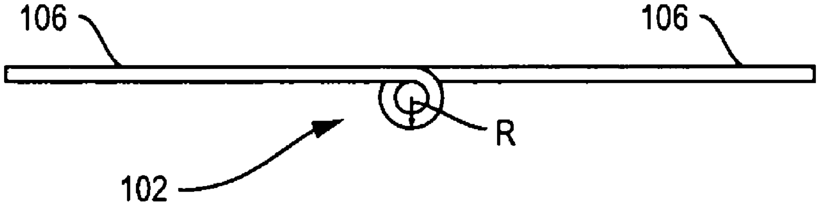

With reference to FIGS. 2A and 2B, the yttria-metal nonlinear filament 33 may include an approximately helical coil 102 comprising a plurality of turns 104. In this case, the coil 102 illustratively may have a coiled length L on the order of several millimeters long, such as 2 to 5 mm, or longer and legs 106 that are about several mm long, measured from the central axis A of the coil. The outer radius R of the coil 102 may illustratively be on the order of 0.5 to 1 mm.

Figure 3:
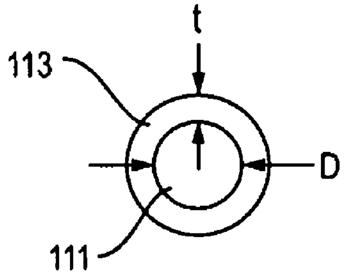
FIG. 3 is a cross sectional view of the nonlinear yttria-metal thermionic filament.

With reference to the cross section shown in FIG. 3, the nonlinear yttria-metal filament 33 comprises an inner metallic wire 111 overlaid by an yttria coating 113. The inner metallic wire 111 is of a high-melting metal such as rhenium, tungsten or an alloy containing rhenium and/or tungsten and may have a diameter D, which may also be referred to as a thickness, of about, e.g., 0.001 to 0.10 inch. For example, the diameter D may be greater than about 0.004 inch, 0.005 or 0.0075 inch. The yttria coating 113 may have a thickness t of about e.g., 2 to 30 μm, for example equal to or greater than about, e.g., 2 μm, 5 μm, 10 μm, 15 μm, or 20 μm.

The yttria coating 113 is illustratively an electrophoretic deposit, for example from a mix of yttrium oxide and aluminum nitrate. In an illustrative embodiment, a rhenium wire 111 of diameter D equal to about 0.008 inch is wound into a coil of four turns with coiled length equal to about 2 mm, an outer radius of about 0.5 mm, and legs each about 6 mm in length. The four-turn coiled wire 111 and an electrode body are immersed in the mix. A voltage is applied between the rhenium wire 111 and the electrode body. After the coiled wire 111 has acquired an yttria coating 113 in the mix, it is removed from the mix and dried overnight by warm air circulating at low pressure. Ideally, the mix is prepared from fresh reagents for each deposition run and not reused subsequently. The resulting yttria-metal coil is conditioned by conducting a current, illustratively of several amperes, for several minutes, or on the order of about one hour.

Referring again to FIG. 1, the illustrative ion source 30 further comprises an electron trap 36 opposing the nonlinear yttria-metal filament 33 across an ionization region 37, which may also be known as an ion volume. A repeller 38 is positioned laterally with respect to the filament 33 and trap 36. Each of the electron trap 36 and the repeller 38 is illustratively a metal body, such as a plate, maintained at a high electrical potential compared to the nonlinear yttria-metal filament 33. The electron trap 36 is configured to maintain a positive voltage, for example several tens to several hundreds of volts, with respect to the filament 33, thereby to accelerate electrons leaving the nonlinear yttria-metal filament 33 across the ionization region 37 for interaction with the constituents conveyed from the gas chromatograph 20. The intervening ionization region 37 may be configured at a voltage on the order of several tens of volts lower than the electron trap 36. The repeller 38 is configured to accelerate ionized constituents in the ionization region 37 toward the ion-guiding apparatus 40. In alternative embodiments, the ion source 30 may be configured without the electron trap 36 and/or a repeller 38. The ion source 30 optionally further comprises magnets (not shown) configured to generate a magnetic field for collimating the electrons leaving the nonlinear yttria-metal filament 33.

The ion-guiding apparatus 40 is configured to electrostatically propel the ionized constituents into the mass analyzer 50. The ion-guiding apparatus 40 may include, e.g., a focusing lens, a collimator or any other well-known apparatus, compatible with the function of the other components of the GC/MS system 10, for guiding ions into the mass analyzer 50.

The mass analyzer 50—for example, a sector field, time-of-flight, ion-trap, or quadrupole analyzer—is configured to sort the ionized constituents according to their respective mass/charge ratios. The detection system 60 is configured to convert each sorted cohort of the ionized constituents into a signal indicative of its relative abundance.

In operation of the GC/MS system 10 in electron ionization mode to analyze a given neutral specimen, the specimen is provided to the gas chromatograph 20. The specimen is conveyed in fractions by a carrier gas, for example helium, from the chromatograph 20 into the ionization region 37 of the ion source 30, where the thermionic electron source 32 generates constituent ions from the gaseous body constituting the specimen. The constituent ions are conveyed through the ion-guiding apparatus 40 into the mass analyzer 50, where the ions are sorted and then passed to the detection system 60 for conversion to data.

In the ion source 30, the solvent fraction of the specimen usually passes through the ionization region 37 before the separated constituents elute. During solvent delay, while the solvent fraction is eluting, the filament current source 34 remains off so that the nonlinear yttria-metal filament 33 is inactive. The length of the solvent delay may be, for example, one or several minutes, depending on, among other parameters, the physical properties of the solvent. After the solvent delay, the filament current source 34 is operated to drive a filament current through the nonlinear yttria-metal filament 33. When the filament current source 34 is cycled on, the filament current may show an initial transient spike, peaking at a high value, for example on the order of about 50% higher than the steady-state value.

When the electronic work function, the minimum energy needed to remove an electron from a solid to a point immediately outside the solid surface, of the nonlinear yttria-metal filament 33 is overcome by the resistive heating generated by the filament current, the filament 33 releases an emission current of electrons. The emission current from the nonlinear yttria-metal filament 33 may be on the order of, e.g., at least about 25 μA, 50 μA, 100 μA, 200 μA, 300 μA, 400 μA or greater. The magnitude of the emission current is related to the magnitude of the filament current provided by the filament current source 34. The necessary filament current depends in general on the dimensions of the metallic wire 111 and its composition, and may be on the order of several amperes. The benefits of using the nonlinear yttria-metal filament 33 are discussed in more detail below.

In the embodiment, the emission current leaving the nonlinear yttria-metal filament 33 is accelerated down a gradient in electrical potential toward the electron trap 36, which is illustratively on the order of about 120 V higher than the nonlinear yttria-metal filament 33. The electrons arrive in the ionization region 37, which is occupied by specimen constituents, with an energy of about 70 eV. A portion of the emitted electrons collide with constituent particles and cause their ionization. The constituent ions are generated by collisions between the emitted electrons and the constituent particles. The repeller 38 pushes the constituent ions toward the ion-guiding apparatus 40. Other electrons in the emission current travel to the electron trap 36 and are measurable as trap current or strike the walls of the ion source 30 and are measurable as the source current.

After sorting in the mass analyzer 50, constituent ions reach the detection system 60, where the mass spectrum is aggregated, as is known to those skilled in the art. The mass spectrum is useful, for example, for identifying compounds of unknown identity, determining the isotopic composition of elements in a known compound, resolving the structure of a compound and, with the use of calibrated standards, quantitating a compound in a sample.

A benefit of the yttria coating 113 in the nonlinear yttria-metal filament 33 is that the work function of the nonlinear yttria-metal filament 33 is decreased and thus, because the filament 33 releases electrons at a lower filament temperature, the filament current supporting a given level of thermionic emission from the filament 33 is lowered, compared to an uncoated wire of the same composition and dimensions of the underlying metallic wire 111. Thus, for a nonlinear yttria-metal filament 33 and an otherwise identical but uncoated nonlinear wire, each producing the same emission current, the nonlinear yttria-metal filament 33 is powered by a lower filament current than would be required for the uncoated nonlinear wire.

For example, the electrophoretically composed four-turn yttria-rhenium helical filament 33 described above may produce an emission current of about 300 μA when driven by a filament current of about 2.5 A. A corresponding uncoated wire of the same morphology and dimensions as the metallic wire 111 in the four-turn yttria-rhenium helical filament 33 would need a filament current of about 3.8 A to achieve an emission current of about 300 μA.

Correspondingly, the nonlinear yttria-metal filament 33 is subject to less electromagnetically induced stress during operation than the identical but uncoated wire, both during any start-up transient and in steady-state "on" operation. Thus during repeated solvent delay cycling for analysis of successive specimens, contact between parts of the nonlinear yttria-metal filament 33 is forestalled compared to the behavior of an identical but uncoated wire. The nonlinear yttria-metal filament 33 may consequently have a longer useful lifetime, illustratively greater than, e.g., five thousand, ten thousand, fifteen thousand, thirty thousand, fifty thousand, or more, on-off cycles.

Furthermore, for the nonlinear yttria-metal filament 33, the filament current supporting a given level of electron emission may decrease after several cycles, so that incremental effect of an on-off cycle diminishes during the lifetime of the nonlinear yttria-metal filament 33. Thus the electromagnetically induced stresses and other lifetime-limiting stresses on the nonlinear yttria-metal filament 33 are not only moderated but also may decrease over time in the thermionic electron source 32.

For the purpose of determining the difference in respective operating temperatures of an yttria-coated and uncoated nonlinear metal thermionic filament, the operating temperature of a thermionic wire is determined by equating the power $P_i$ put into and the heat $Q_i$ radiatively dissipated from the filament i: $P_i=Q_i$. Furthermore, $Q=\pi\sigma\epsilon d_i\ l_i\times(T_i^4-298^4)$, in which $\epsilon$ is the emissivity of the wire 111 (~0.9 for rhenium), $\sigma$ is Stefan-Boltzmann constant ($5.67\times10^{-8}$ W/m$^2$K$^4$), $T_i$ is filament temperature in K, $d_i$ is diameter of the wire in m, and $l_i$ is length of the wire in m; $P_i=I_i^2R_i$, in which $R_i$ is the resistance of the filament i at the operating temperature $T_i$. $T_i$ can be found by iterative solution of the equalities.

For example, for the rhenium four-turn helical wire described above, the dependence of the resistance $R_i$ on temperature may be expressed as $R_i/0.3=(T_i/298)^{0.85}$. Comparing a four-turn yttria-metal helical filament 33 driven by a filament current of about 2.5 A and the corresponding uncoated wire 111 which must be driven by a filament current of about 3.8 A to emit the same emission current, the solution yields a difference $T_{uncoated}-T_{yttria\text{-}metal}=698°$ C. Metal creep is thermally activated, following an Arrhenius-type temperature function. Therefore, an operating temperature $T_{yttria\text{-}metal}$, lower than $T_{uncoated}$, for example by several hundred degrees, for example 500° C., 600° C., 700° C., or more, lowers the creep rate of the rhenium significantly. Thus, the yttria-metal filament 33 far exceeds a similar uncoated filament in its resistance to creep during extended use, consistent with the morphological integrity and associated extended lifetime observed for the yttria-metal helical filament 33.

The yttria coating 113 of the nonlinear yttria-metal filament 33 may furthermore extend the lifetime of the filament 33 by protecting the underlying metallic wire 111 from attack by aggressive agents such as halogens originating in the solvent or constituents of the specimen or oxygen from air leaks or gaseous samples; and by insulating against shorting between portions of the nonlinear filament 33 that come into adventitious contact.

Although specific features of the invention are included in some embodiments and not in others, it should be noted that individual features may be combinable with any or all of the other features in accordance with the invention. Furthermore, other embodiments are compatible with the described features. For example, the electron source 32 containing the nonlinear yttria-metal filament 33 may be disposed in a system lacking any chromatographic preseparation, such as in a system wherein the specimen is provided to the ion source 30 after processing by, e.g., thermogravimetric analysis or directly, without pretreatment. For another example, the ion source 30 may be configured to operate in chemical ionization mode, so that the gaseous body with which the emission current from the nonlinear yttria-metal filament 33 interacts is a reagent gas which in turn ionizes the specimen. Such variations will be evident to those skilled in the art.

It will therefore be seen that the foregoing represents a highly advantageous approach to thermionic electron source construction, particularly for GC/MS systems. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of analyzing a specimen by mass spectrometry, the method comprising the steps of:

providing a filament comprising a substantially helical metallic substrate bearing a coating of yttria;

connecting a current source across the substrate;

operating the current source to drive a current through the substrate, thereby causing the filament to emit electrons;
irradiating a halogen-containing gaseous body with the emitted electrons; and
detecting constituent ions of the specimen.

2. The method of claim 1 wherein the substrate is substantially of rhenium.

3. The method of claim 1 wherein the electrons emitted from the filament constitute an emission current of at least 200 μA.

4. The method of claim 1 wherein the coating is an electrophoretic deposit.

5. The method of claim 1 wherein the filament has several turns and further comprising cyclically operating the current source alternately to drive current through the substrate and not drive current through the substrate for at least 5000 cycles without inducing contact between any of the several turns.

6. The method of claim 1 wherein the filament has several turns and further comprising cyclically operating the current source alternately to drive current through the substrate and not drive current through the substrate for at least 10,000 cycles without inducing contact between any of the several turns.

7. The method of claim 1 further comprising cyclically operating the current source alternately to drive current through the substrate and not drive current through the substrate and decreasing the current driven through the substrate after several cycles, the emitted electrons constituting an emission current remaining substantially constant while the current source is driving current after decreasing the current driven through the substrate.

8. The method of claim 1 wherein the coating is at least 10 μm thick.

9. The method of claim 3 wherein the substrate emits the emission current at a first temperature which is lower by at least 500° C. than a second temperature at which the substrate would emit the emission current in the absence of the coating.

10. The method of claim 1 wherein the metallic substrate is at least 0.0075 inches in thickness.

11. The method of claim 1 further comprising the step of fractionating the specimen by gas chromatography.

12. A mass spectrometer system comprising:
a nonlinear metallic substrate, bearing a coating of yttria, constituting a filament in an ion source;
a current source configured to provide a current through the substrate on and off cyclically, to release an emission current of at least 100 μA from the filament during each of 5000 consecutive cycles, the coating protecting the substrate from a halogen-containing specimen during operation of the current source;
a mass analyzer;
a detector; and
a gas chromatograph configured to deliver separated constituents to the ion source.

13. The mass spectrometer of claim 12 wherein the metallic substrate is a substantially helical coil.

14. The method of claim 1 wherein the gaseous body is a chemical ionization reagent gas.

15. The method of claim 1 wherein the metallic substrate comprises a metal selected from rhenium, tungsten, and an alloy thereof.

16. The method of claim 10 wherein the metallic substrate is a wire of cylindrical cross section having a diameter of at least 0.0075 inches.

17. A method of analyzing a specimen by mass spectrometry, the method comprising the steps of:
providing a filament comprising a nonlinear metallic substrate bearing a coating of yttria;
configuring a current source to drive a current through the substrate thereby releasing an emission current from the filament;
cycling the current source on-off for at least 5000 cycles at an emission current of at least 100 μA during each cycle without inducing mutual contact between portions of the filament;
irradiating a gaseous body with electrons emitted from the filament when current is driven therethrough; and
detecting constituent ions of a specimen wherein the gaseous body includes a halogenated constituent.

18. The method of claim 17 wherein the current source is cycled for at least 15,000 cycles without inducing mutual contact between portions of the filament.

19. The method of claim 17 further comprising decreasing current driven through the substrate after several cycles, substantially without decreasing an emission current constituted by electrons emitted from the filament.

20. The method of claim 17 wherein the gaseous body is provided from a gas chromatograph.

21. The method of claim 17 wherein the gaseous body is provided from a thermogravimetric analysis apparatus.

22. The method of claim 17 wherein the gaseous body includes gaseous oxygen.

23. The method of claim 17 wherein the gaseous body is a chemical ionization reagent gas.

24. The method of claim 1 wherein the substrate is substantially helical.

* * * * *